(12) United States Patent
Chu

(10) Patent No.: US 8,269,098 B2
(45) Date of Patent: Sep. 18, 2012

(54) THERMOELECTRIC MODULE DEVICE WITH THIN FILM ELEMENTS AND FABRICATION THEREOF

(75) Inventor: Hsu-Shen Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 558 days.

(21) Appl. No.: 12/206,575

(22) Filed: Sep. 8, 2008

(65) Prior Publication Data

US 2009/0277490 A1 Nov. 12, 2009

(30) Foreign Application Priority Data

May 9, 2008 (TW) .............................. 97117142 A

(51) Int. Cl.
 *H01L 35/28* (2006.01)
 *H01L 35/02* (2006.01)
(52) U.S. Cl. ......................... 136/208; 136/230; 136/212
(58) Field of Classification Search .................. 136/208, 136/230, 212
 See application file for complete search history.

(56) References Cited

U.S. PATENT DOCUMENTS

| 3,779,814 | A | * | 12/1973 | Miles et al. ................. 136/236.1 |
| 3,794,527 | A | * | 2/1974 | Kim .............................. 136/208 |
| 4,036,665 | A | * | 7/1977 | Barr et al. ...................... 136/202 |
| 5,022,928 | A | | 6/1991 | Buist |
| 5,228,923 | A | | 7/1993 | Hed |
| 6,818,470 | B1 | | 11/2004 | Acklin et al. |
| 6,828,579 | B2 | | 12/2004 | Ghamaty et al. |
| 2002/0118032 | A1 | * | 8/2002 | Norris et al. .................... 324/760 |
| 2002/0170590 | A1 | * | 11/2002 | Heremans et al. ............. 136/240 |

FOREIGN PATENT DOCUMENTS

| TW | 466320 | 10/2001 |
| TW | 200625703 | 7/2006 |
| TW | 200731586 | 11/2006 |

* cited by examiner

*Primary Examiner* — Jonathan Johnson
*Assistant Examiner* — Shannon Gardner

(57) ABSTRACT

A thermoelectric module device with thin film elements is disclosed. A pillar structure with a hollow region is formed by stacking a plurality of thin-film type thermoelectric module elements, each including a plurality thin-film thermoelectric pairs arranged in a ring. An insulating and thermal conducting layer covers the inner sidewalls of the hollow region of the pillar structure and the outer sidewalls of the pillar structure. A cool source and a heat source are disposed in the hollow region or outer side of the pillar structure, respectively.

17 Claims, 6 Drawing Sheets

THERMOELECTRIC MODULE DEVICE WITH THIN FILM ELEMENTS AND FABRICATION THEREOF

BACKGROUND OF THE INVENTION

1. Field of the Invention

The invention relates to a thermoelectric module device and fabrication thereof, and more particularly relates to a thin film thermoelectric module device.

2. Description of the Related Art

A thermoelectric module device is a device capable of transforming electricity into heat and/or heat into electricity, and can be applied in cooling/heating and generating electric power. When electricity is applied to a thermoelectric module device, heat absorption and heat release are generated on opposite ends of the device, thus allowing for cooling or heating. When two ends of a thermoelectric module device have temperature differences, the device can output direct current and can thus be used to generate electric power.

FIG. 1 shows a cross section of a conventional thermoelectric module device. As shown in this figure, a conventional thermoelectric module device typically comprises a bulk-shaped p-type thermoelectric material 108, a bulk-shaped n-type thermoelectric material 106, a bottom conductive metal layer 112, a top conductive metal layer 110, a top insulating substrate 104 and a bottom insulating substrate 102. As shown in FIG. 1, the p-type thermoelectric material 108 and the n-type thermoelectric material 106 are typically arranged vertically and both are connected by the bottom conductive metal layer 112 and the top conductive metal layer 110. Taking the application of inputting electricity for cooling for example, direction of the current transference in the p-type thermoelectric material 108 and the n-type thermoelectric material 106 is parallel to the direction of heat transference in the thermoelectric module device and heat absorption and release are generated at the top and bottom ends. Taking the application of generating electric power with temperature differences as an example, direction of the thermal flow in the p-type thermoelectric material and the n-type thermoelectric material is also parallel to the direction of electricity transference. However, this device does not have high efficiency because of the limitation of the figure of merit (ZT) of bulk-shaped thermoelectric material. Typically, the greatest cooling capacity is only 3~5 W/cm$^2$ and the electrical power generating efficiency with temperature difference of 200° C. is only 2~3%. Therefore, it is desired for a thermoelectric module device to use high ZT thermoelectric material in order to improve thermoelectric transforming efficiency.

Professors Hick and Dresselhaus of Massachusetts Institute of Technology in year 1993 disclosed that ZT can be greatly improved when size of the thermoelectric material is reduced to nano-scale. Venkatasubramanian et al. of RTI research institute in year 2001 disclosed that the p-type $Bi_2Te_3/Sb_2Te_3$ super lattice thin film can have a ZT value of about 2.4 at room temperature, which breaks through the bottleneck of ZT values of less than 1. American Hi-Z company researched a p-type $B_4C/B_9C$ and an n-type Si/SiGe quantum well thin film and estimated the thin film to have ZT value larger than 3. According to the research results above, thin film thermoelectric material has the advantage of a high ZT value and can break through bottlenecks associated with the conventional buck-shaped thermoelectric material. In addition, because a thermoelectric module device with a small size is easy to be formed, less material is used for thin film thermoelectric material. Also, thermoelectric material is used widely for cooling a micro electronic device micro or producing a high efficiency thermoelectric generator.

However, the thin film thermoelectric material is not highly efficient when directly used in conventional devices. Referring to FIG. 2, which shows a cross section of a conventional thermoelectric module device comprising thin film thermoelectric material. A p-type thermoelectric material thin film 216 and an n-type thermoelectric material thin film 210 are interposed between a top substrate 204 and a bottom substrate 202, and the p-type thermoelectric material thin film 216 and the n-type thermoelectric material thin film 210 are disposed on a metal column 206 and bottom conductive metal layer 212, and below the top conductive metal layer 208. The p-type thermoelectric material thin film 216 and the n-type thermoelectric material thin film 210 can be attached to the top substrate 204 by the top solder layer 214, and the metal column 206 is attached to the bottom substrate 202 by the bottom solder layer 218.

As shown in FIG. 2, when the thermoelectric thin film materials 216, 210 having high ZT are directly used in the conventional thermoelectric module device, the cooling/heating or electricity generating efficiency is not good, because the thermoelectric thin film materials 216, 210 are too thin (about tens of nanometers to tens of micrometers thick) and the heating and cooling sources of the thermoelectric module device are too close to generate heat flow transference back easily. Further, because the thermoelectric thin film materials 216, 210 are very thin, electricity and heat resistance between the thermoelectric thin film materials 216, 210 and the metal layer 208, 212 greatly affects the device, and joule's heating also reduces efficiency of the device. Hence, the device directly applied with the thermoelectric thin film materials 216, 210 having high ZT does not perform as well as expected.

BRIEF SUMMARY OF INVENTION

Due to the issues described, the invention provides a thermoelectric module device with thin film elements is disclosed. A pillar structure with a hollow region is formed by stacking a plurality of thin-film type thermoelectric module elements, each comprising a plurality thin-film thermoelectric pairs arranged in a ring. An insulating and thermal conducting layer covers the inner sidewalls of the hollow region of the pillar structure and the outer sidewalls of the pillar structure. A cool source and a heat source are disposed in the hollow region or outer side of the pillar structure, respectively.

A method for forming a thin film type thermoelectric module device is disclosed. A plurality of ring-shaped thin film type thermoelectric module elements are formed and then stacked with each other. A top insulating layer and a bottom insulating layer are formed on a top side and a bottom side of the stacked ring-shaped thin film type thermoelectric module elements to form a main hollow pillar structure. An electrical output wire and an electrical input wire are formed to electrically connect to the thin film type thermoelectric module element to the top side or bottom side of the hollow pillar main structure. An insulating and thermal conductive layer is formed to respectively cover an inner sidewall of the hollow region and an outer sidewall of the main hollow pillar structure, wherein a cooling source or a heating source is disposed within the hollow region or an outer side of the hollow pillar main structure.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
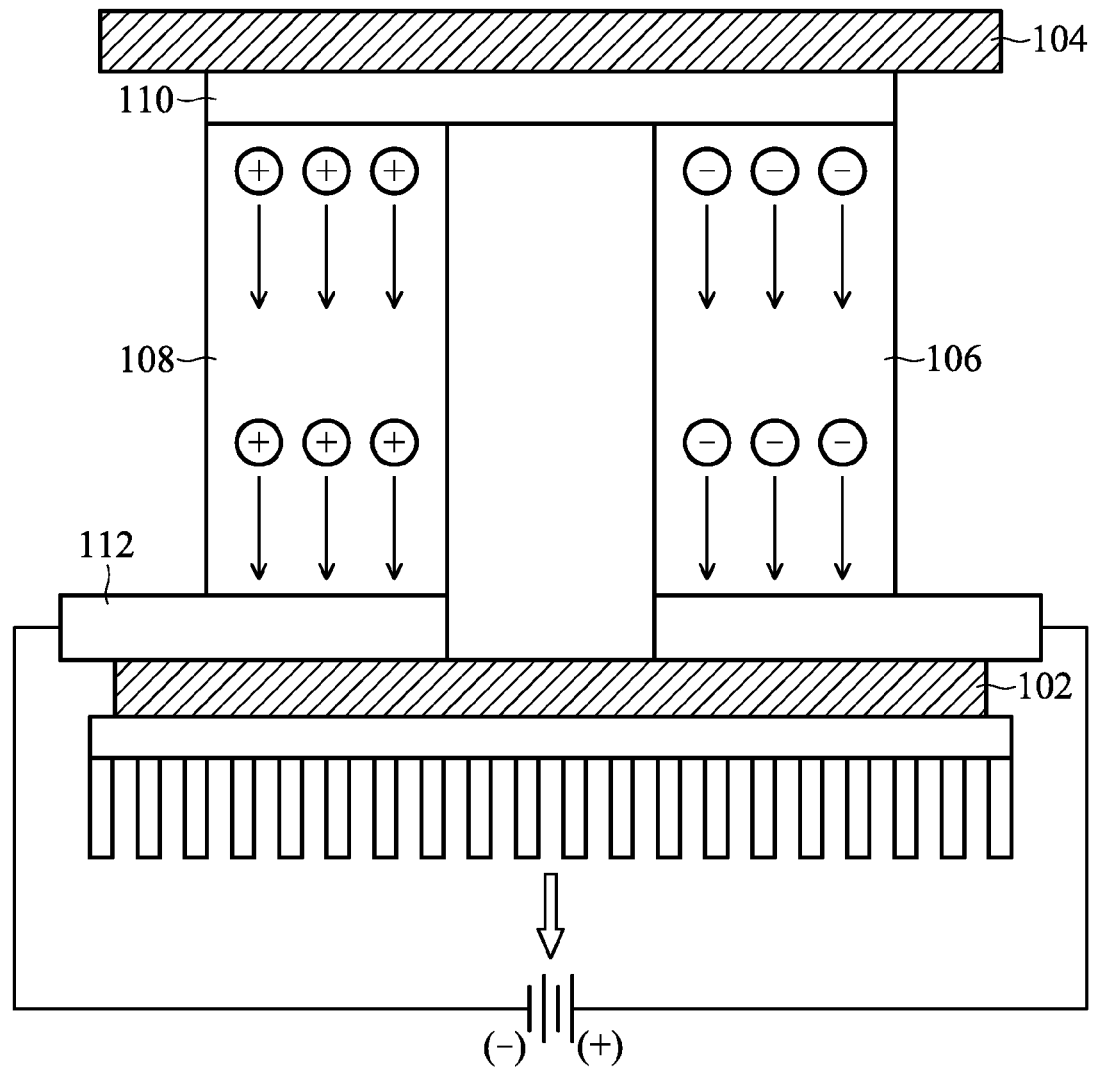
FIG. 1 shows a cross section of a conventional thermoelectric module device.
Figure 2:
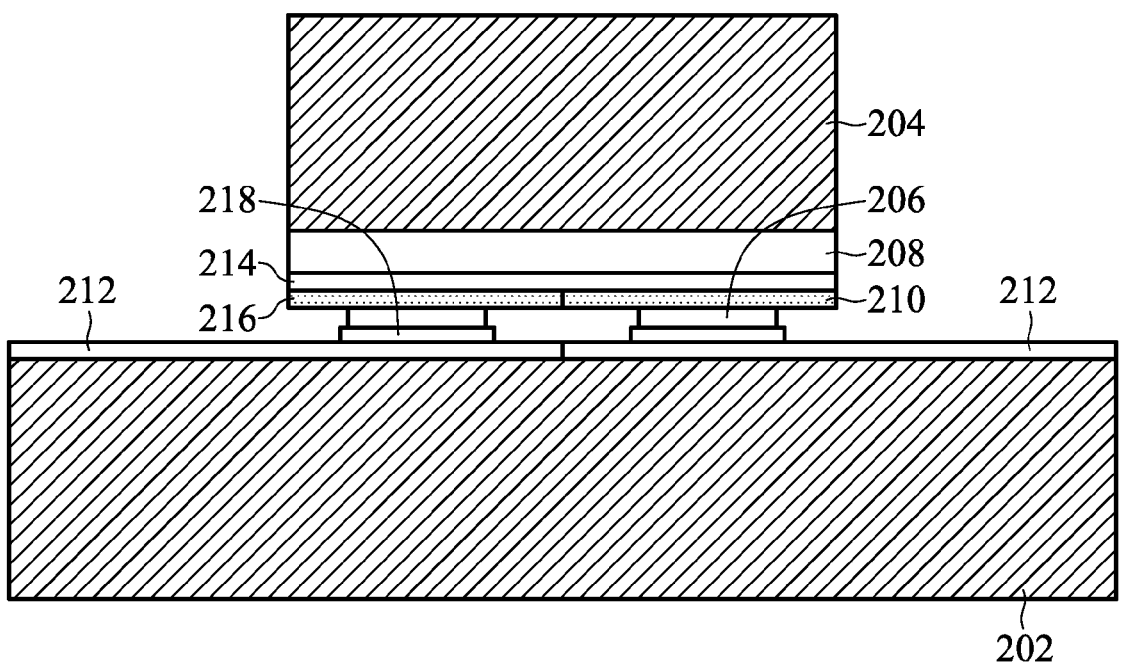
FIG. 2 shows a cross section of a conventional thermoelectric module device comprising thin film thermoelectric material.
Figure 3A:
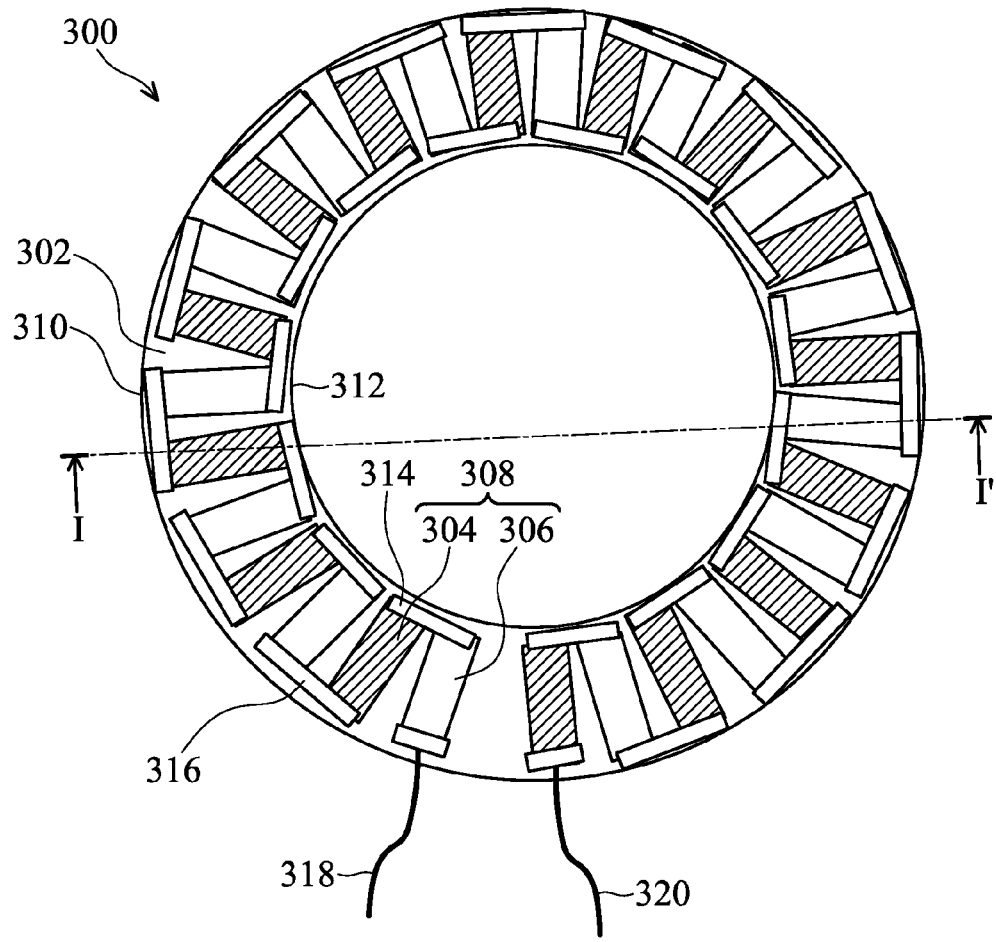
FIG. 3A shows a plan view of a thermoelectric module device of an embodiment of the invention.

A method for forming a thin film type thermoelectric module element 300 of an embodiment of the invention is illustrated in accordance with FIG. 3A~FIG. 6. First, referring to FIG. 3A and FIG. 3B, FIG. 3B shows a cross section along line I-I' of FIG. 3A, a ring-shaped substrate 302 comprising an inner edge 312 and an outer edge 310. The ring-shaped substrate 302 preferably includes electrical and heat insulating material, such as ceramics with low thermal conductivity or heat resistant macromolecule material, wherein the ceramics can comprise cubic zirconia or $WSe_2$, and the heat resistant macromolecule material can comprise polyimide. A plurality of p-type thermoelectric thin film elements (TEE) 304 and n-type thermoelectric thin film elements 306 are formed on a surface of the ring-shaped substrate 302 by, for example deposition. In the embodiment, the p-type TEE 304 and the n-type TEE 306 are about 10 nm~200 μm thick. In addition, the p-type TEE 304 and the n-type TEE 306 of the embodiment comprises high-ZT semiconductor materials, half metallic elements or chemical compounds, such as $Bi_2Te_3$ series doped with Te and Se, PbTe, PbSnTe series, Si and SiGe series, Half-Heusler intermetallic alloy series (a ferromagnetism nonferrous alloy), silicide compound series or $WSe_2$ series. In addition, the thermoelectric thin film can be deposited by sputtering, thermal evaporation, cathodic arc ion depositing, chemical vapor depositing, electroplating or chemical depositing, etc.

Figure 3B:
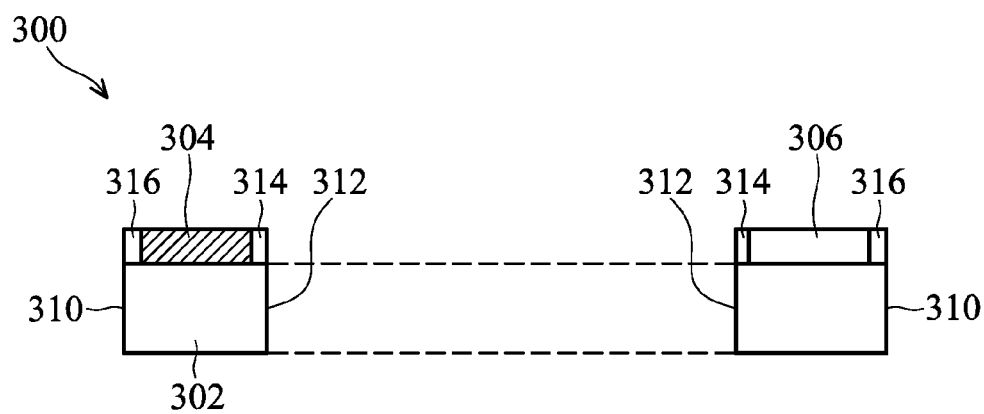
FIG. 3B shows a cross section along line I-I' of FIG. 3A.

A first conductive layer 314 is formed by, for example a deposition process, to electrically connect neighboring p-type TEE 304 and n-type TEE 306, and p-type TEE 304 and n-type TEE 306 with each other to constitute a thermoelectric thin film pair 308. A second conductive layer 316 is formed to electrically connect neighboring thermoelectric thin film pairs 308. In the embodiment, the first conductive layer 314 and the second conductive layer 316 can be formed by conductive metals or alloys, such as Cu, Fe, Cr, Ni, Mo, Sn, Ag, Au, etc. Therefore, as shown in FIG. 3A and FIG. 3B, a plurality of thermoelectric thin film pairs 308 are arranged in a ring type on the surface of the ring-shaped substrate 302. A plurality of first conductive layers 314 are close to the inner edge 312 of the ring-shaped substrate 302, and a plurality of second conductive layers 316 are close to the outer edge 310 of the ring-shaped substrate 302. The first conductive layer 314 electrically connects the p-type TEE 304 and n-type TEE 306 of a thermoelectric thin film pair 308 together. The second conductive layer 316 electrically connects neighboring thermoelectric thin film pairs together. For example, the second conductive layer 316 electrically connects the n-type TEE 306 of the thermoelectric thin film pair 308 and the p-type TEE 304 of the neighboring thermoelectric thin film pair 308. Hence, forming the thin film type thermoelectric module element 300 of the embodiment.

Figure 4:
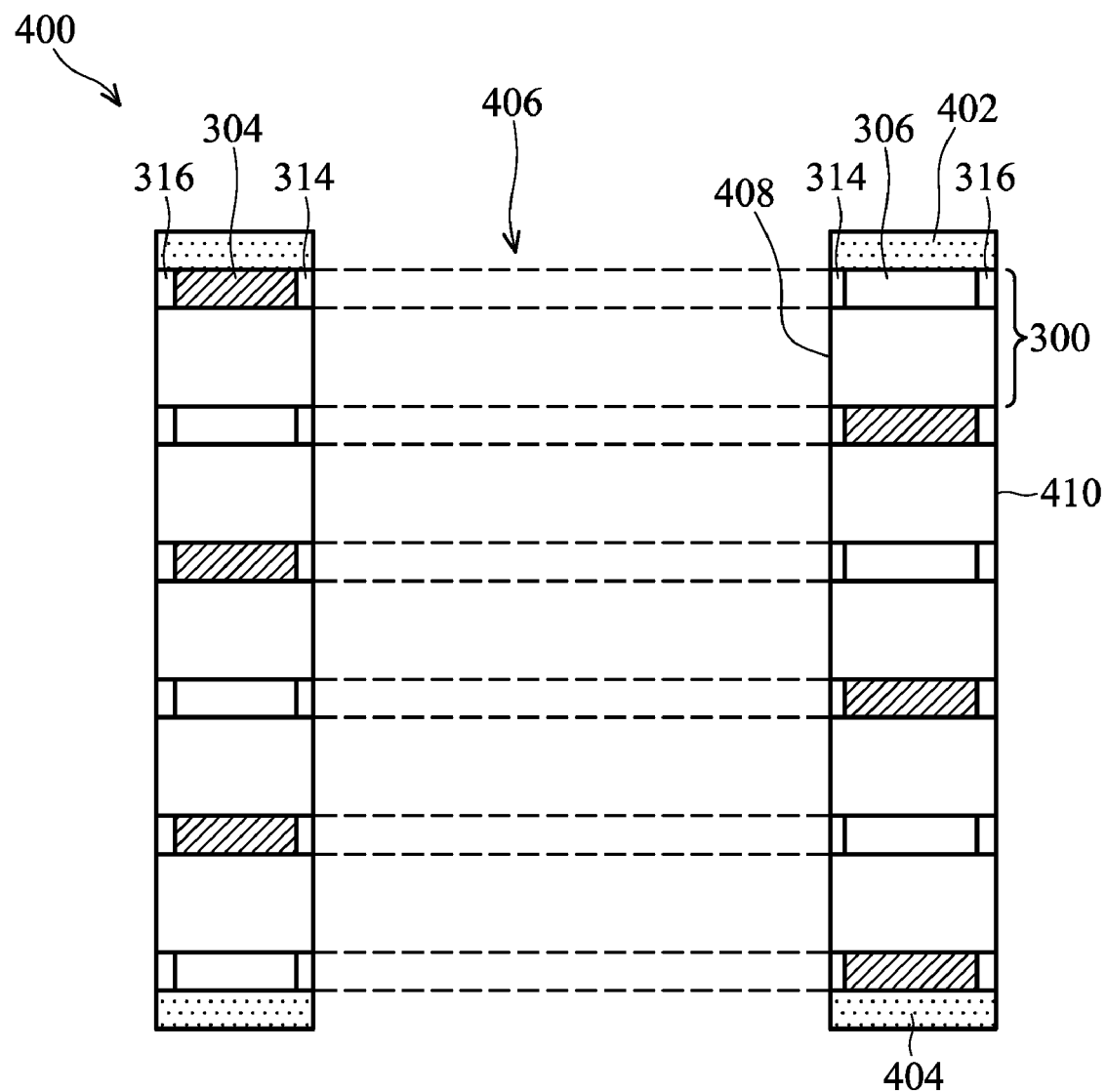
FIG. 4 shows an intermediate cross section of a thermoelectric module device of an embodiment of the invention.

Referring to FIG. 4, a plurality of thin film type thermoelectric module elements 300 is stacked. A top insulating layer 402 is formed to be attached to the top thin film type thermoelectric module element 300, and a bottom insulating layer 404 is formed to be attached to the bottom thin film type thermoelectric module element. As shown in this figure, the thin film type thermoelectric module elements 300 are stacked to form a main hollow pillar structure 400, and the top side and the bottom side of the main hollow pillar structure 400 are covered with the top insulating layer 402 and the bottom insulating layer 404, respectively. It is noted that the top insulating layer 402 and the bottom insulating layer 404 do not overlap with the hollow region 406 within the inner edge 408 of the main hollow pillar structure 400, which means that the hollow region 406 of the hollow pillar 400 is passed therethrough.

The fabrication of the electrical power input wire and electrical power output wire are illustrated in accordance with FIG. 3A. The embodiment forms the electrical power input wire and electrical power output wire at the top thin film type thermoelectric module element and/or the bottom thin film type thermoelectric module element of the main hollow pillar structure 400. Referring to FIG. 3A, the thin film type thermoelectric module element 300 shown in FIG. 3A is assumed to be at the top side or bottom side of the hollow pillar main structure, the first conductive wire 318 is electrically connected to the p-type TEE 304 of the front thermoelectric thin film pair 308 through a conductive layer, and the second conductive wire 320 is electrically connected to the n-type TEE 306 of the end thermoelectric thin film pair 308 through another conductive layer. The first and second conductive wires connected to the top or bottom thin film type thermoelectric module element are the electrical power input wire 318 and the electrical power output wire 320 of the thermoelectric module device of the embodiment.

Figure 5:
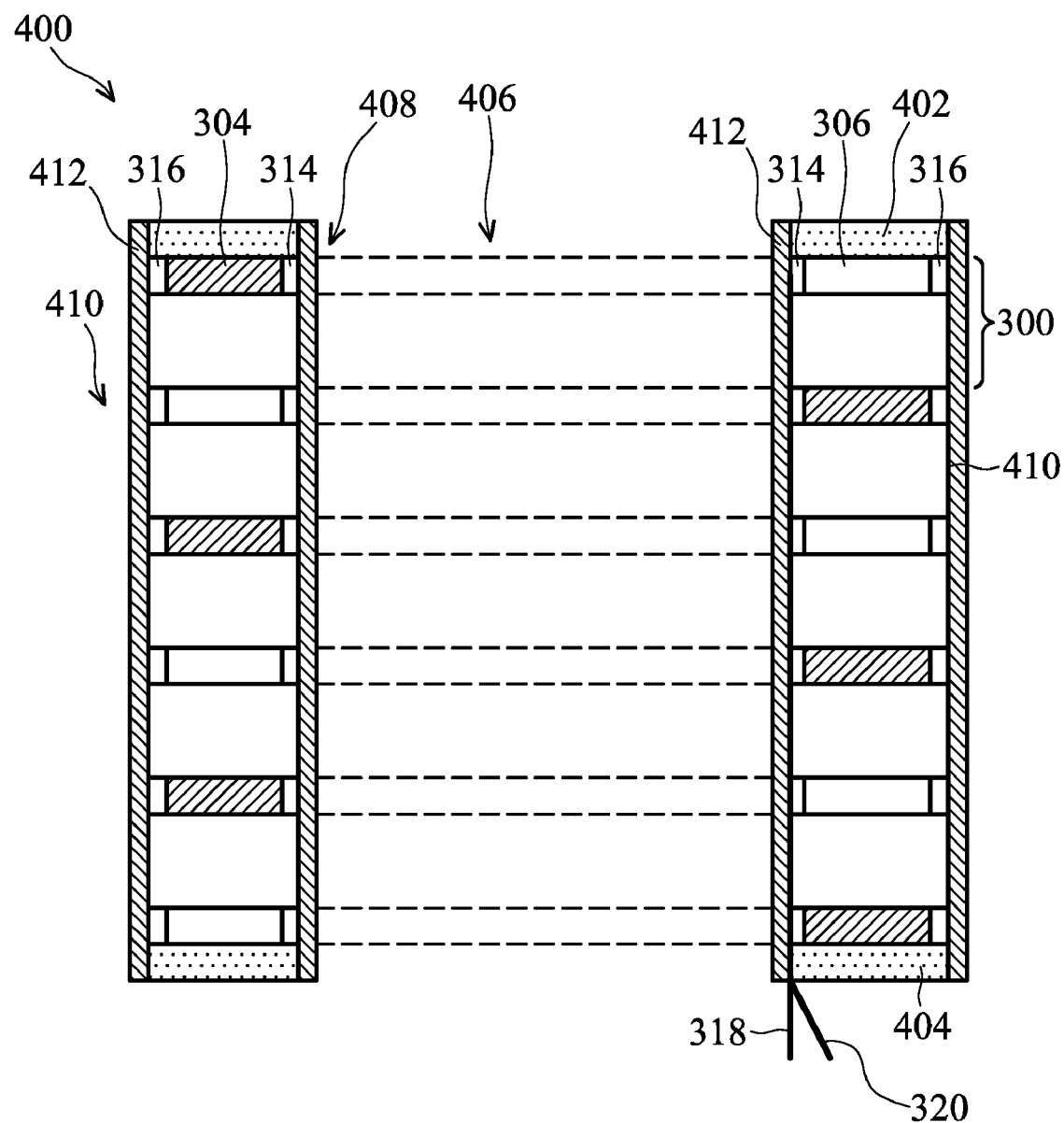
FIG. 5 shows an intermediate cross section of a thermoelectric module device of an embodiment of the invention.

Referring to FIG. 5, after forming the electrical power input wire 318 and the electrical power output wire 320, the insulating and thermal conductive layer 412 is formed to cover the inner edge 408 (the inner sidewall of the hollow region 406) and the outer edge 410 of the main hollow pillar structure. Thus, forming the thin film type thermoelectric module device of the embodiment. In the embodiment, the insulating and thermal conductive layer 412 can be ceramic materials, such as $Al_2O_3$, AlN, BN or metal covered with insulating and thermal conductive material, in which the insulating and thermal conductive material can be $Al_2O_3$ or AlN and the metal material can be Al, Cu, metal based composite materials, graphene or carbon composite materials.

Figure 6:
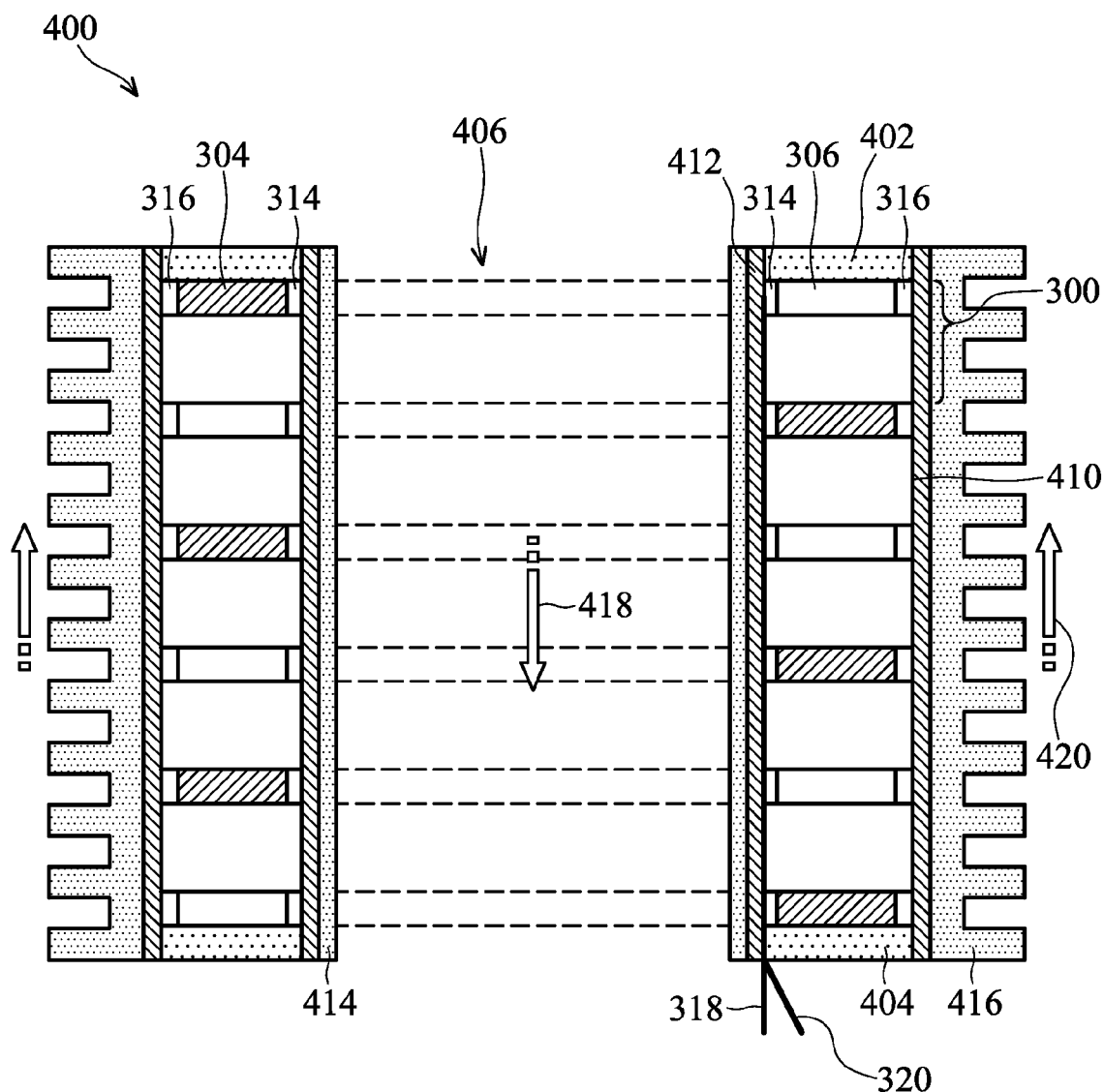
FIG. 6 shows a finalized cross section of a thermoelectric module device of an embodiment of the invention.

Application of the thin film type thermoelectric module device of the embodiment is illustrated in accordance with FIG. 6. The embodiment applies different temperature conditions between the inner side and the outer side of the hollow pillar thin film type thermoelectric module device. Specifically, referring to FIG. 6, a fluid tube 414 is set into the hollow region 406 of the thin film type thermoelectric module device. Note that the fluid tube 414 contacts the insulating and thermal conductive layer 412 and is inlet with high temperature fluid 418. Further, a heat dispersing apparatus 416 is connected to the outer edge of the thin film type thermoelectric module device and can be passed therethrough by a low temperature fluid 420. In the embodiment, the heat dispersing apparatus 416 can be metal fin including fans, metal fin without fans, fin formed of carbon composite materials, graphene, metal foams or graphene foams, and the fluid 418, 420 can be liquid or gas.

According the description above, the thin film type thermoelectric module device can generate electric power when the inner and outer sides are treated with different temperature conditions. It is noted that the invention is not limited to the embodiment described. For example, the thin film type thermoelectric module device of the invention is not limited to setting a fluid tube 414 into the hollow region 406, but the fluid tube can be replaced with a metal bar with good heat conducting characteristics. In addition, the thin film type thermoelectric module device of the invention is not limited to being connected to the heat dispersing apparatus 416 at the outer side, but can be arranged connected to other apparatuses. Furthermore, the thin film type thermoelectric module device of the invention is not limited to generating electric power with temperature differences. It can also be used to cooling or heating at the inner and outer sides respectively by inputting electric current to the first conductive wire 318 and the second conductive wire 320.

It is noted that the temperature difference or electric current passing through the thin film type thermoelectric module device is parallel to the surface orientation of the p-type TEE 304 and the n-type TEE 306. Hence, the distance between the cooling source and the heating source at the inner or outer side 408, 410 of the hollow pillar thin film type thermoelectric module device is long enough to eliminate issues of reflective heat transference, thus reducing the effect of generating temperature difference. Further, the hollow pillar thin film type thermoelectric module device 400 of the embodiment of the invention described is formed by stacking of a plurality of thin film type thermoelectric module elements 300, and cooling and heating sites are set at inner or outer sides of the device, respectively. Therefore, high temperature and low temperature fluid 418, 420 can easily pass through the device to accumulate and dispense heat. In addition, the device of the embodiment of the invention has better design flexibility and electrical power efficiency generation because the device can vary the number of thin film type thermoelectric module elements 300 to be stacked according to application, to more efficiently use heat of the high temperature fluid 418.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). For example, both the p-type TEE and the n-type TEE are formed on the upper surface of the ring-shaped substrate in FIG. 3, but they can alternatively be formed on the lower surface of the ring-shaped substrate in another. Furthermore, people in the art can design the p-type TEE and the n-type TEE to be formed on the upper surface and lower surface of the ring-shaped substrate respectively according application of products. Therefore, the scope of the appended claims should be accorded the broadest interpretation so as to encompass all such modifications and similar arrangements.

What is claimed is:

1. A thin film type thermoelectric module device, comprising:
   a main hollow pillar structure with a hollow region therein, wherein the main hollow pillar structure is formed by stacking a plurality of ring-shaped thin film type thermoelectric module elements and each of the ring-shaped thin film type thermoelectric module element comprises a plurality of thermoelectric thin film pairs each comprising a p-type thermoelectric thin film element (p-type TEE) and an n-type thermoelectric thin film element (n-type TEE) arranged in a ring on a ring-shaped substrate;
   the thin film type thermoelectric modules arranged along a ring direction on the ring-shaped substrate, wherein
   an insulating and thermal conductive layer respectively covering an inner sidewall of the hollow region and an outer sidewall of the hollow pillar main structure,
   wherein a cooling source or a heating source is disposed within the hollow region or an outer side of the hollow pillar main structure,
   wherein top surfaces of the p-type thermoelectric thin film elements and the n-type thermoelectric thin film elements of a lower ring-shaped thin film type thermoelectric module element directly contact a bottom surface of the ring-shaped substrate of an upper ring-shaped thin film type thermoelectric module element,
   wherein the p-type thermoelectric thin film elements (p-type TEE) and the n-type thermoelectric thin film elements (n-type TEE) of the same layer are arranged alternatively with a direction parallel to a surface of the ring-shaped substrate.

2. The thin film type thermoelectric module device as claimed in claim 1, wherein the thin film type thermoelectric module device has a temperature difference or a current transference with a direction parallel to a surface of the p-type TEE or the n-type TEE.

3. The thin film type thermoelectric module device as claimed in claim 1, wherein the main hollow pillar structure further comprises a top insulating layer and a bottom insulating layer at top or bottom sides, and the top insulating layer and the bottom insulating layer do not cover the hollow region.

4. The thin film type thermoelectric module device as claimed in claim 1, wherein each of the thin film type thermoelectric module elements comprises:
   the ring-shaped substrate;
   the thin film type thermoelectric modules arranged along a ring direction on the ring-shaped substrate;
   a first conductive layer electrically connecting the p-type TEE and the n-type TEE; and
   a second conductive layer electrically connecting neighboring thin film type thermoelectric modules.

5. The thin film type thermoelectric module device as claimed in claim 4, wherein both the p-type thermoelectric thin film element and the n-type thermoelectric thin film element are disposed on the same surface of the ring-shaped substrate.

6. The thin film type thermoelectric module device as claimed in claim 4, wherein the ring-shaped substrate is able to insulate against heat and electricity.

7. The thin film type thermoelectric module device as claimed in claim 6, wherein the ring-shaped substrate comprises ceramics or heat resistant macromolecule.

8. The thin film type thermoelectric module device as claimed in claim 7, wherein the ceramics comprise cubic zirconia or $WSe_2$, and the heat resistant macromolecule material comprises polyimide.

9. The thin film type thermoelectric module device as claimed in claim 4, wherein the p-type thermoelectric thin film element and the n-type thermoelectric thin film element have thicknesses of about 10 nm ~200 μm.

10. The thin film type thermoelectric module device as claimed in claim 4, wherein the p-type thermoelectric thin film element or the n-type thermoelectric thin film element is formed of material comprising $Bi_2Te_3$ series doped with Te and Se, PbTe, PbSnTe series, Si and SiGe series, Half-Heusler Intermetallic alloy series (a ferromagnetism nonferrous alloy), silicide compound series or $WSe_2$ series.

11. The thin film type thermoelectric module device as claimed in claim 1, further comprising an electrical output wire and an electrical input wire electrically connected to the thin film type thermoelectric module element on the top side or bottom side of the main hollow pillar structure.

12. The thin film type thermoelectric module device as claimed in claim 1, wherein the heat source is a fluid tube passing through the hollow region of the hollow pillar main structure.

13. The thin film type thermoelectric module device as claimed in claim 12, wherein the cool source is a heat dispersing apparatus connected to the outer side of the hollow pillar main structure.

14. The thin film type thermoelectric module device as claimed in claim 13, wherein high temperature fluid or low temperature fluid passes through the fluid tube or the heat dispersing apparatus, and the high temperature fluid or low temperature fluid is liquid or gas.

15. The thin film type thermoelectric module device as claimed in claim 13, wherein the heat dispersing apparatus is a metal fin including fans, metal fin without fans, fin formed of carbon composite materials, graphene, metal foams or graphene foams.

16. The thin film type thermoelectric module device as claimed in claim 1, wherein the insulating and thermal conductive layer is ceramic material or a structured layer covered with insulating and thermal conductive material.

17. The thin film type thermoelectric module device as claimed in claim 16, wherein the ceramic material is $Al_2O_3$, AlN, BN, and the structured layer is Al, Cu, metal based composite materials, graphene or carbon composite materials.

* * * * *